United States Patent [19]

Usami et al.

[11] Patent Number: 5,391,501
[45] Date of Patent: Feb. 21, 1995

[54] METHOD FOR MANUFACTURING INTEGRATED CIRCUITS WITH A STEP FOR REPLACING DEFECTIVE CIRCUIT ELEMENTS

[75] Inventors: Mitsuo Usami, Akishima; Keijiro Uehara, Sagamihara, both of Japan

[73] Assignee: Hitachi, Ltd., Tokyo, Japan

[21] Appl. No.: 147,569

[22] Filed: Nov. 5, 1993

[30] Foreign Application Priority Data

Nov. 12, 1992 [JP] Japan .................................. 4-302053

[51] Int. Cl.⁶ ............................................. H01L 21/00
[52] U.S. Cl. ........................................ 437/7; 437/923; 437/54; 437/205
[58] Field of Search ............... 437/900, 923, 926, 939, 437/233, 54, 7; 148/DIG. 12

[56] References Cited

U.S. PATENT DOCUMENTS 4,806,503  2/1989  Yoshida et al. .................. 437/206

FOREIGN PATENT DOCUMENTS

| 55-156333 | 12/1980 | Japan . |
| 56-02646  | 1/1981  | Japan . |
| 61-206234 | 9/1986  | Japan . |
| 61-255032 | 11/1986 | Japan . |
| 1-209736  | 8/1989  | Japan . |

Primary Examiner—George Fourson
Assistant Examiner—David Mason
Attorney, Agent, or Firm—Antonelli, Terry, Stout & Kraus

[57] ABSTRACT

A method for manufacturing a semiconductor integrated circuit device is described. The method comprises forming a plurality of macrocells each comprising a semiconductor integrated circuit on a semiconductor layer of an SOI (silicon on insulator) substrate, subjecting an insulating film for element separation and an insulating film in the substrate to wet etching thereby removing an unnecessary macrocell, and attaching a desired macrocell separated fabricated to the removed macrocell region. The semiconductor integrated circuit device is also described, which is free of defects and has multifunction and high reliability.

12 Claims, 20 Drawing Sheets

| OPERATION MODE \ WIRING | TM | OS |
|---|---|---|
| SHIFT-IN MODE | H | L |
| OUTPUT DATA SETTING MODE | H | H |
| SHIFT-OUT MODE | H | L |

METHOD FOR MANUFACTURING INTEGRATED CIRCUITS WITH A STEP FOR REPLACING DEFECTIVE CIRCUIT ELEMENTS

BACKGROUND OF THE INVENTION

The present invention relates to a semiconductor integrated circuit device which is substantially free of any defect and is highly reliable and also, to a method for manufacturing such a device wherein it is easy to remedy defective chips and to replace an element by a fresh one.

A technique for remedying a defective chip during the course of the manufacture of semiconductor integrated circuit devices is described, for example, in Japanese Patent Laid Open No. 174538/91. This technique will now been outlined.

First, a plurality of macrocells having the same circuit function is formed on the surface of a substrate having a silicon-on-insulator structure (hereinafter referred to simply as SOI substrate), and a wiring is formed for each macrocell. The term "macrocell" used herein means a fundamental circuit element for constituting a semiconductor integrated circuit device in a chip region, i.e., a unit for realizing function by means of an electric circuit. At this stage, individual macrocells are electrically isolated from one another.

At the outer periphery of the macrocells formed are substrate main surface side-dividing trenches which arrive at the underlying insulating layer of a substrate of the SOI structure or at a portion which is slightly deeper than the underlying insulating layer. An insulating film comprising silicon dioxide ($SiO_2$) is filled up in each trench.

Subsequently, the circuit function and electric characteristics of the individual macrocells within the chip region are checked. The term "chip" used herein means a unit capable of realizing function by integration of the macrocells. The insulating film in a dividing trench at the outer periphery of the macrocell which has been judged as defective is removed. Thereafter, the SOI substrate is formed at the opposite side thereof with a back side-dividing trench, which is positioned in correspondence with the defective macrocell, until the back side-dividing trench arrives at a corresponding main surface side-dividing trench. By this, the defective macrocell is removed.

A good quality macrocell (hereinafter referred to as good macrocell), which is removed from other SOI substrate according to a procedure such as, for example, for removing for the defective macrocell, is mounted in position where the defective macrocell has been removed. Finally, a synthetic resin such as polyimide is filled up in the back side-dividing trench, thereby fixing the good macrocell.

The macrocells are electrically interconnected by means of wirings, thereby forming an intended semiconductor integrated circuit.

We have found that the above prior art has the following problems.

In prior art, removal of a defective or good macrocell essentially requires a trench which has been preliminarily formed at the back side of the substrate. When using a laser beam for the formation of the trench, a number of microcracks are undesirably produced in the substrate. Even if a damaged layer is removed by chemical etching, the damaged range is wide and it is difficult to check how far the microcracks have been removed. Thus, this leads to the problems such as of degradation of processing accuracy and a lowering in reliability of the semiconductor device.

The degradation of processing accuracy would have the possibility of placing a very severe limitation on the removal of defective macrocells and also on the distance between individual macrocells on mounting of a good macrocell.

In addition, the processes for the defective macrocell and good macrocell become complicated, with an attendant problem that the costs are increased as a whole.

SUMMARY OF THE INVENTION

The invention has been made under these circumstances in the art and has for its object the provision of a method for manufacturing a semiconductor integrated circuit device at high accuracy in a simple manner without producing any microcrack and also of the semiconductor integrated circuit device formed by the method.

Another object of the invention is to provide a method for manufacturing a defect-free, polyfunctional and reliable semiconductor integrated circuit device and the device formed.

One aspect of the invention resides in a method which comprises: providing an SOI substrate wherein an interface between the insulating film and the semiconductor substrate is a mirror face; forming a plurality of macrocells, each having a primary wiring, in a chip region of the semiconductor substrate, checking whether plural macrocells are each defective or good; removing a defective macrocell judged by the check to an extent including a lower side of the insulating film of the SOI substrate; embedding a good macrocell, from which an insulating film has been removed to an extent of its lower surface, in position of the defective macrocell from a backside of the SOI substrate and fixing the good macrocell with an adhesive; and after replacement of the defective macrocell, subjecting the macrocells in the chip region to secondary wiring for electric connection.

Another aspect of the invention resides in that a macrocell having a different circuit function, which has been formed either by a process whose conditions are different from those conditions for the outer periphery of the defective macrocell or of a material different in type from that of the defective macrocell, is embedded in the position where the defective macrocell has been removed.

These and other objects and many of the attendant advantages of the invention will be readily appreciated as the same becomes better understood by reference to the following detailed description when considered in connection with the accompanying drawings.

DETAILED DESCRIPTION OF THE INVENTION

Figure 1:
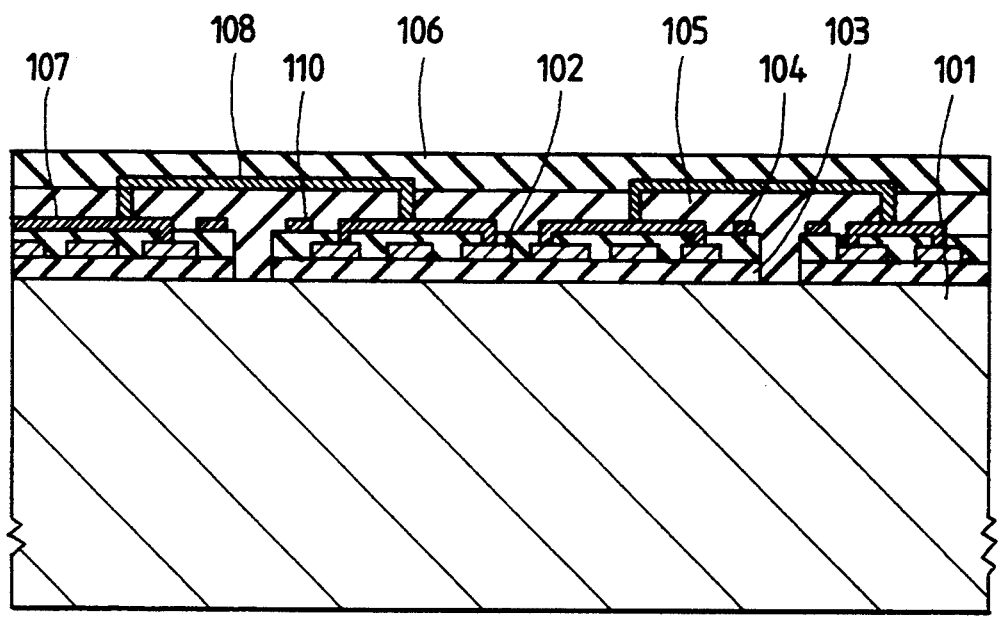
FIG. 1 is a sectional view of an essential part of a substrate subjected to wiring after fixing of a good macrocell according to one embodiment of the invention.

Use of an SOI substrate permits silicon devices and wiring layers connecting the devices therewith to take such a structure as to be surrounded by silicon oxide. When using an etchant for mainly removing the silicon oxide, it becomes possible to easily remove unnecessary macrocell portions in very high accuracy along the directions of plane and depth. Especially, when an SOI substrate having a mirror interface between the insulating film and the semiconductor substrate is employed, the semiconductor substrate surface which is exposed after removal of the insulating film has good flatness. This enables one to embed a good macrocell in high accuracy. The embedded good chip suffers no stress owing to the irregularities on the substrate surface, thereby providing a highly reliable semiconductor device.

It will be noted that with a bonding-type substrate, the substrate surface can be flattened to an extent of approximately 1 nm by appropriate processing. The term "mirror surface" used herein is intended to mean a surface which has a flatness of ±1 nm.

The use of such an etching technique as set out above is substantially free of any damage, such as microcracks, and ensures processing of high reliability while overcoming the drawback as will be caused by dry etching alone wherein the flatness of the bottom surface at the removed portion is not good owing to the dependence on the stepped shape of the surface.

When a macrocell having a different circuit function is arranged in a chip region, it will become possible to alter the logic of the semiconductor integrated circuit or to extend the function of the semiconductor integrated circuit.

Embodiments of the invention are described with reference to the accompanying drawings in which reference numerals indicate the followings.

Designated at 1 is a primary wiring process, at 2 is a macrocell inspecting process, at 3 is a defective macrocell replacing process, at 3a is a a substrate main surface-side dividing trench forming process, at 3c is a defective macrocell removing process, at 3d is a good macrocell mounting process, at 3e is a good macrocell fixing process, at 3f is a substrate main surface-side dividing trench filling-up process, at 3g is a substrate main surface side-flattening process, at 4 is a secondary wiring process, at 5 is a substrate, at 5a is a semiconductor layer, at 5b is an embedded insulating layer, at 5c is a semiconductor layer, at 5d is a multilayer wiring layer, at 6 is a chip region, at 7 is a macrocell, at 7a is a defective macrocell, at 8 is a circuit region in the cell, at 9 is an input and output circuit region, at 10 is a pad, at 11 is a test pad, at 12 is a shift register circuit unit, at 13 is a shift register, at 13a is an input shift register, at 13b is an output shift register, at 14a, 14b, 15a, 15b, 17, 18, 20 21, 23a and 23b are, respectively, AND circuits, at 25 is an insulator, at 26 is an intra-cell wiring, at 27 is a probe, at 28 and 109 are, respectively, resist films, at 29 is a defective macrocell separated portion, at 101 is a silicon substrate, at 102 is a silicon device, at 102a is a silicon layer, at 103 is a silicon oxide film of an SOI substrate, at 104 is a silicon device-dividing silicon oxide film, at 105 is a trench-filling, flattening silicon oxide film, at 106 is is a surface silicon oxide film, at 107 is a primary wiring, at 108 is a secondary wiring, at 110 is a test pad, at 111 is a protective film, at 112 is an adhesive, at 113 is a tape, at 114 is a self-adhesive, at 115 is a support substrate, at 116 is a silicon oxide film of a first SOI substrate, at 117 is a silicon oxide film of a second SOI substrate, at 118, 119 are, respectively, silicon layers, at 120 is a silicon oxide film, at 201 is a memory cell portion, at 202 is an address control unit, at 203 is a data input and output unit, at 204 is a pad, at 500 is a processor for processing instruction and operation comprising a fused semiconductor integrated circuit, at 501 is a system control device comprising a fused semiconductor integrated circuit, at 502 is a main memory comprising a silicon semiconductor integrated circuit, at 503 is a data communication interface comprising a compound semiconductor integrated circuit, at 504 is a data communication control device, at 505 is an input and output processor, at 506, 507 are, respectively, ceramic substrates, at 508 is a central processing unit, at 509 is an input and output processor mounting substrate, and at 510 is an optical fiber for data communication.

EMBODIMENT 1

In this embodiment, the description is made to application of the invention to a logical LSI chip. It will be noted that the semiconductor integrated circuit to be formed is not limited to a logical LSI, but various changes may be made.

FIG. 1 is a sectional view of an essential part of an SOI substrate wherein after fixing of a macrocell, a wiring has been completed. First, the arrangement of macrocells is outlined. Silicon devices 102 which are formed on a single crystal silicon substrate 101 are surrounded with silicon oxide films including a silicon oxide film 103 formed in the SOI substrate and a silicon device-dividing oxide film 104. The silicon devices 102 constitute a macrocell through a primary wiring 107 and serve also as a test circuit. With the primary wiring 107, any wiring interconnecting the macrocells is not formed at all and the individual macrocells are electrically independent of one another. In this arrangement, the macrocells can be individually tested through a test pad 110 to check whether each macrocell is good or defective. If a macrocell is checked as defective, it is subjected to patterning at the main surface side and then to etching of the oxide film constituting the defective cell and the oxide film provided at the lower portion of the defective cell. As a result, the silicon device 102 of the defective macrocell and the related primary wiring 107 can be very easily removed in high accuracy. A good macrocell obtained from another substrate is attached to the portion where the defective macrocell has been removed. The good macrocell has the same structure as the defective macrocell. Since an SOI substrate is employed, the good macrocell from which silicon has been removed from the back side of the SOI substrate is provided, resulting in very ease in fabrication and high accuracy. A trench around the good macrocell which has been filled in and bonded is filled up, for example, with silicon oxide and is thus flattened at the main surface side of the substrate. The macrocells are interconnected with a secondary wiring 18 as shown in the figure. A surface silicon oxide film 106 is formed for surface protection to obtain an LSI.

Figure 2:
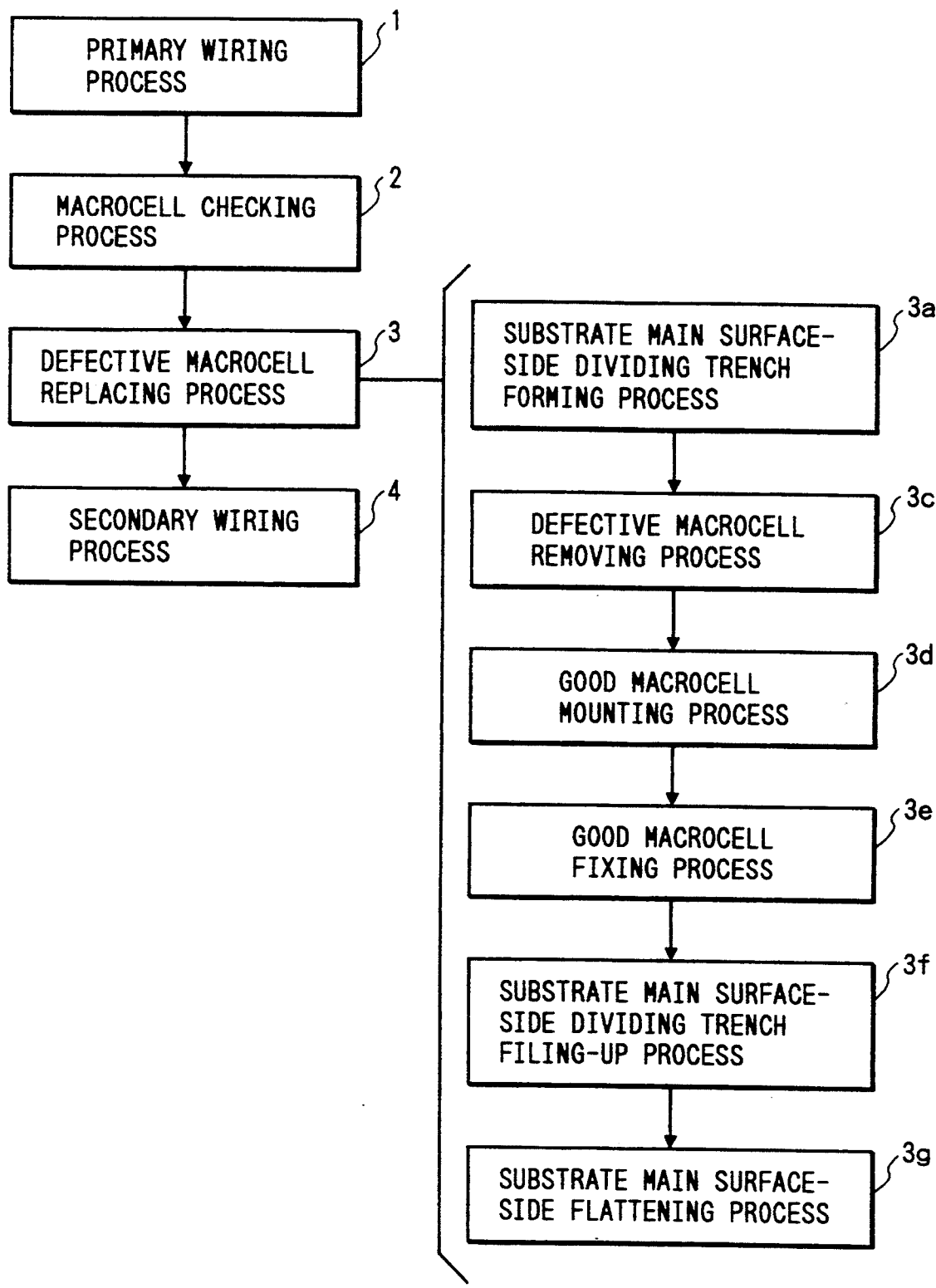
FIG. 2 is a process chart showing a method for manufacturing a semiconductor integrated circuit device according to the invention.

FIG. 2 shows a process for fabricating the semiconductor device. This process comprises four processes including a primary wiring process 1, a macrocell inspecting process 2, a defective macrocell replacing process 3 and a secondary wiring process 4. The defective macrocell replacing process 3 comprises six processes as will be described hereinafter.

Figure 3:
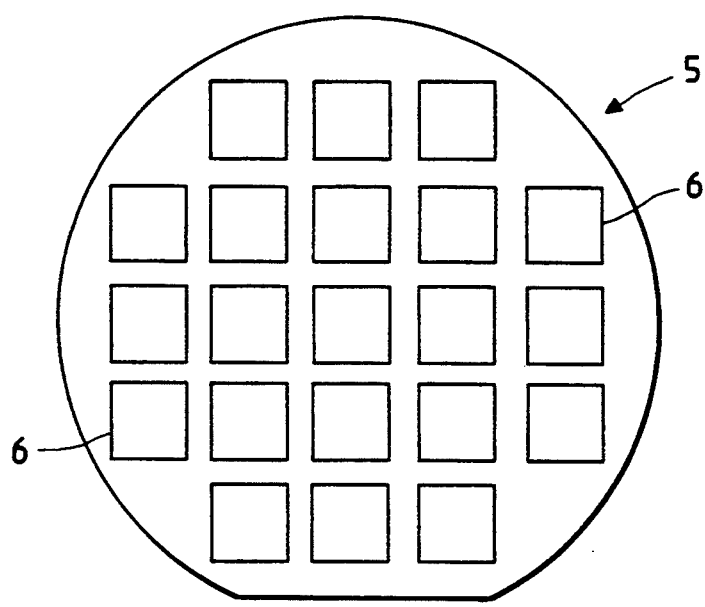
FIG. 3 is a plan view of a substrate obtained immediately after completion of a primary wiring process.

An SOI substrate obtained immediately after completion of the primary wiring process 1 is shown in FIG. 3. The SOI substrate 5 includes a silicon (Si) single crystal substrate, a silicon dioxide film formed on the substrate and having a thickness, for example, of about 0.5 $\mu$m, and a single crystal silicon layer formed on the silicon dioxide film and having a thickness, for example, of about 1 $\mu$m. The diameter of the substrate 5 used is 6 inches. On a main surface of the substrate 5, there are arranged thirty-two chip regions 6, for example. The size of each chip region 6 is about 20 mm ×20 mm, for example.

Figure 4:
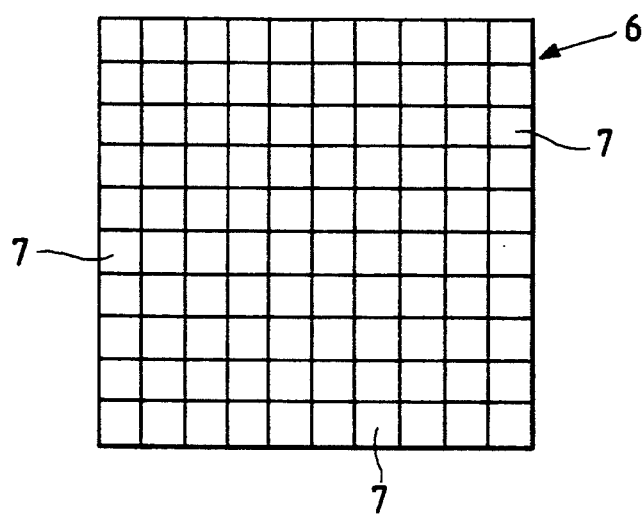
FIG. 4 is an enlarged plan view of the chip region formed in the substrate shown in FIG. 3.

FIG. 4 is an enlarged plan view of the chip region 6. For example, 400 macrocells 7 are arranged in the form of a lattice in each chip region 6. The size of each macrocell 7 is, for example, about 1 mm×1 mm. It will be noted that the SOI substrate, insulating film and semiconductor layer are not limited with respect to those materials used above.

In the respective macrocells 7 there are formed intra-cell circuits having different circuit functions, provided that at this stage, the macrocells 7 are not interconnected by wiring. More particularly, the intracell circuits of the respective macrocells 7 are independent of one another.

Figure 5:
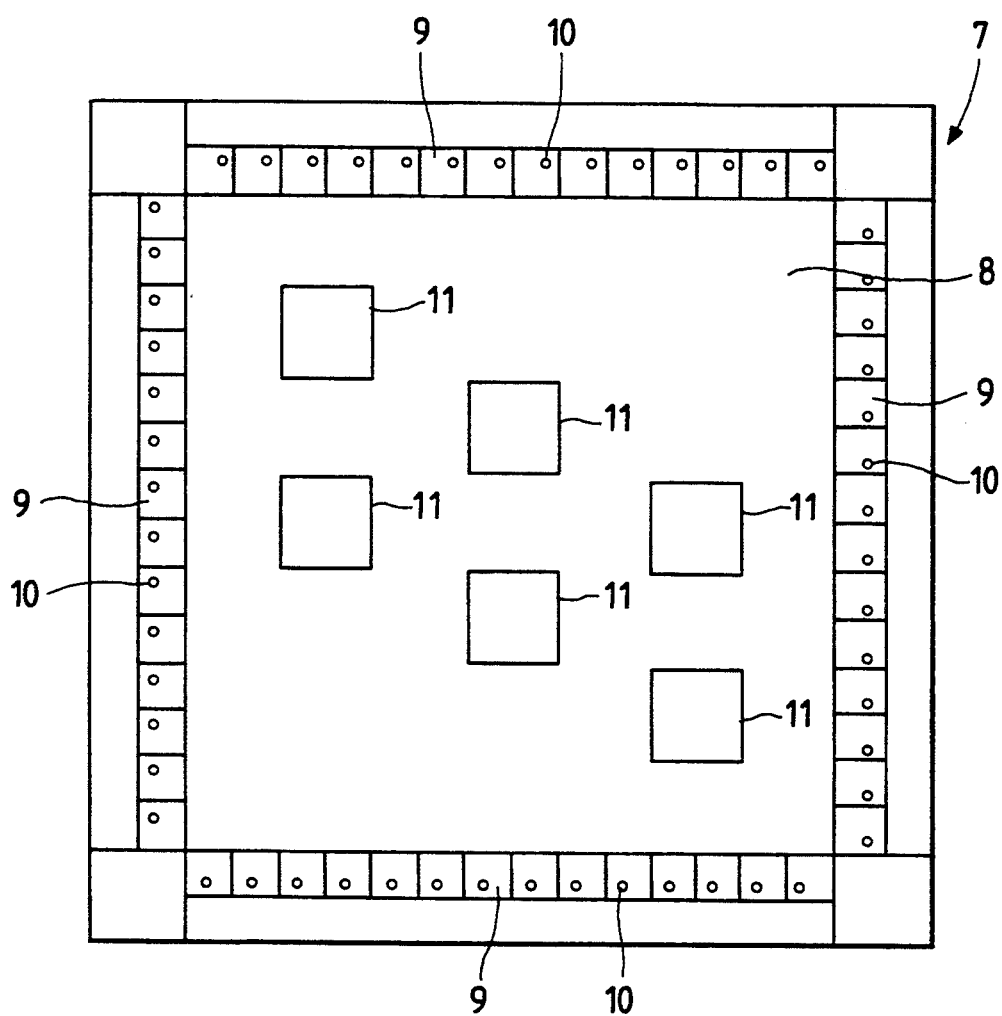
FIG. 5 is an enlarged plan view of a macrocell formed in the chip region in FIG. 4.

FIG. 5 is an enlarged plan view of each macrocell 7. Centrally of the macrocell 7 is formed an intra-cell circuit region 8, for example. In the intra-cell circuit region 8 is formed an intra-cell circuit such as a gate array of, for example, 3K gates.

It should be noted that the intra-cell circuit is not limited to a gate array, but various changes may be made. For example, the intra-cell circuit may be a circuit having static RAM (SRAM) of 16 Kb to 64 Kb or analogue circuits.

In the outer periphery of the intra-cell circuit region 8 there are arranged a plurality of input-output circuit regions 9. In each input-output region 9 there is formed a predetermined input-output circuit such as an input-output buffer, for example.

A pad 10 is arranged in each input-output circuit region 9. The pads 10 are for interconnection of the macrocells 7 in the secondary wiring process. The number, N, of the pads 10 is, for example, $N=1.9\times G^{0.6}$ in accordance with Lenz's law wherein the number of gates is G. For example, if $G=300$, $N=232$. Thus, at least 232 pads 10 are formed in each macrocell 7.

According to this embodiment, in the macrocell inspecting process 2 which will be described later, each macrocell 7 is checked for electrical characteristics by means of a prober or the like. However, in the macrocell 7 which is as fine as 1 mm square, it is very difficult to bring probes into abutment with 232 pads 10.

In this embodiment, this problem is solved by the application of a scan test method. The general scan test method is described in, for example, "Custom LSI Application Design Handbook," Realize Inc. (Feb. 28, 1984), pp. 108–113 or Japanese Patent Laid Open No. 69349/82.

In this embodiment, probes are brought into abutment with a small number of test pads 11 formed on the main surface of the macrocell 7 to check electric characteristics of the intra-cell circuit.

Each test pad 11 is arranged, for example, on the intra-cell circuit region 8 of each macrocell. The number of the test pads 11 is, for example, 5 to 11. In this degree of the test pad number, it is possible to form test pads 11 of a size large enough to permit abutment of probes therewith even on a 1 mm square macrocell 7. The size of each test pad 11 is, for example, 50 µm×50 µm.

The test pads 11 are arranged regularly on each macrocell 7. Thus, in this embodiment, the macrocells 7 and the test pads are, respectively, arranged regularly, so that in the inspection of the macrocells 11, it is possible to bring probes into regular abutment with the test pads 15 in each macrocell 7. Thus, the inspection of all the macrocells 7 can be done quickly and efficiently.

Figure 6:
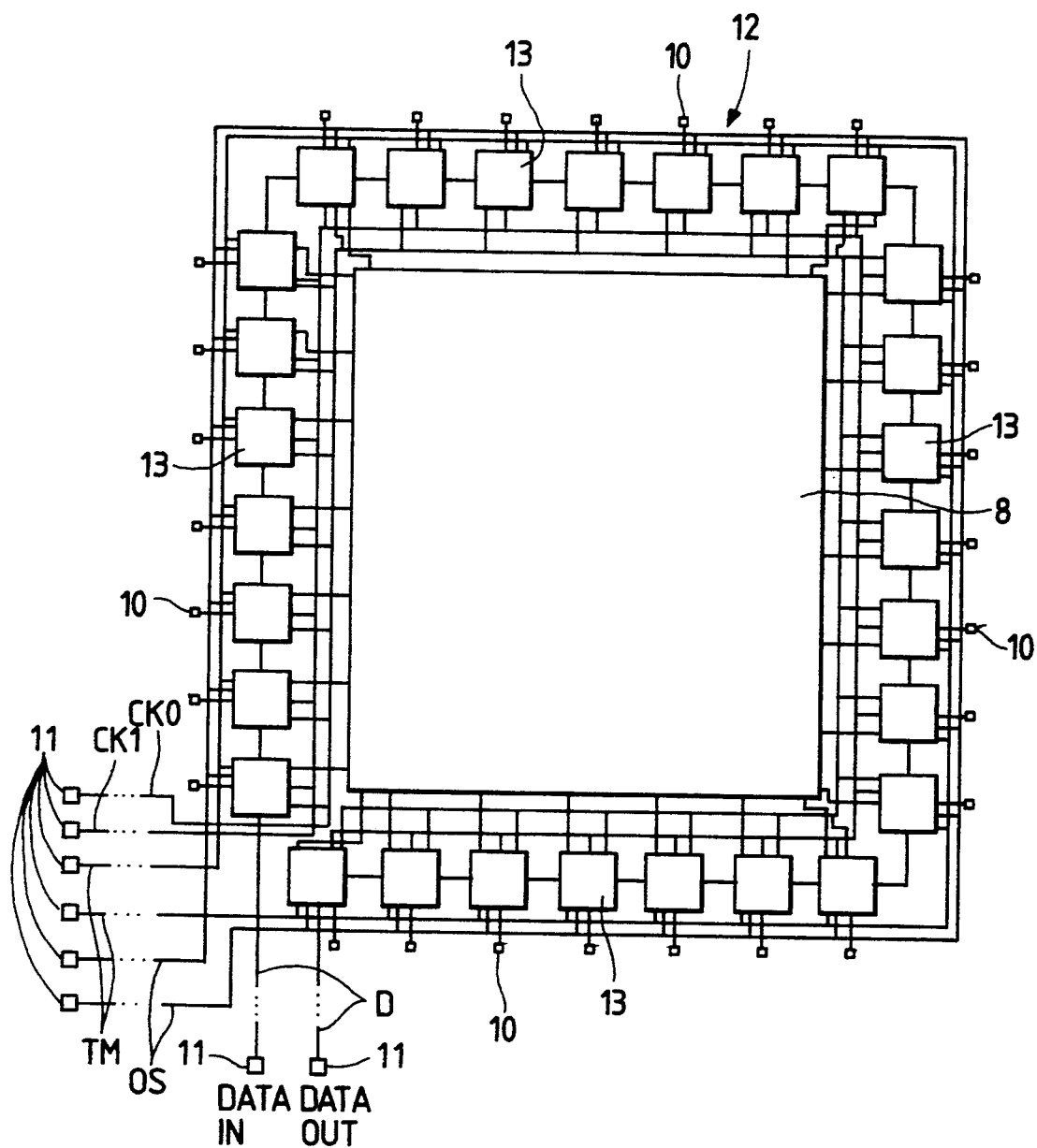
FIG. 6 is a circuit diagram showing a shift register circuit portion formed in the chip region shown in FIG. 4.

The test pads 11 are electrically connected to the intra-cell circuit through shift register circuit portions arranged at an outer periphery of the input-output circuit region 9 shown in FIG. 5, for example. The shirt register circuit portions are shown in FIG. 6.

The shift register circuit portion 12 has an arrangement of a plurality of shift registers 13 which are interconnected in series by line.

Figures 7, 8:
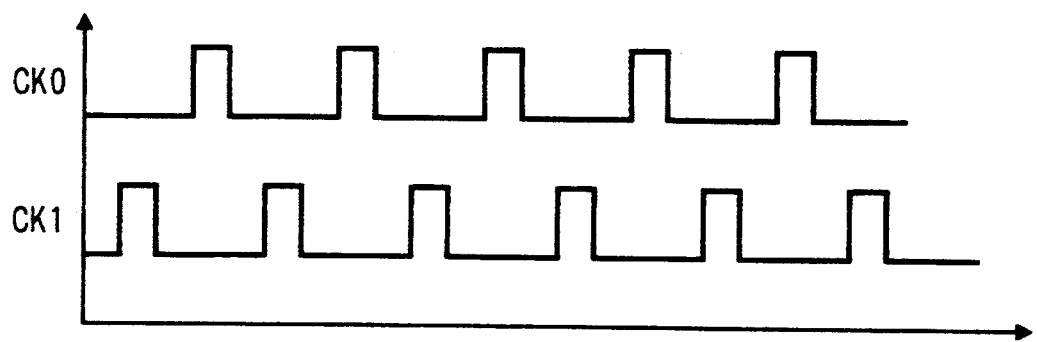
FIG. 7 is a timing chart of clock signals for taking synchronism of the shift register circuit portion.
FIG. 8 is a diagram showing showing signal levels of control lines during operation of the shift register circuit portion.

Lines CK0 and CK1 are for the transmission of such clock signals as shown in FIG. 7 to each shift register 13. Lines TM and OS are control lines for controlling the operation of the shift register circuit portion 12. To the line OS is transmitted a signal for changing the operation mode of the shift register circuit portion 12 into a test mode, while to the line OS is transmitted a signal for setting detection data provided from the intra-cell circuit into the shift registers 13. Signal levels of the control lines during operation of the shift register circuit portion 12 are shown in FIG. 8.

Figure 9:
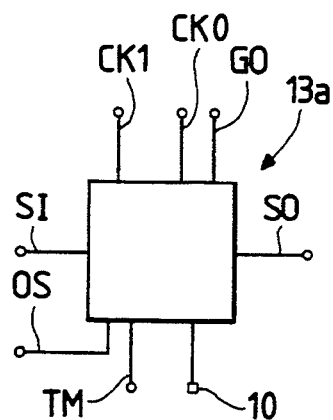
FIG. 9 is a symbolic diagram of an input shift register.

The shift registers 13 are classified into input shift registers and output shift registers. FIG. 9 shows symbols of an input shift register 13a. Line SI is a shift-in line and line SO is a shift-out line. These lines SI and SO correspond to lines D of FIG. 6. Line GO is electrically connected to the intra-cell circuit.

Figure 10:
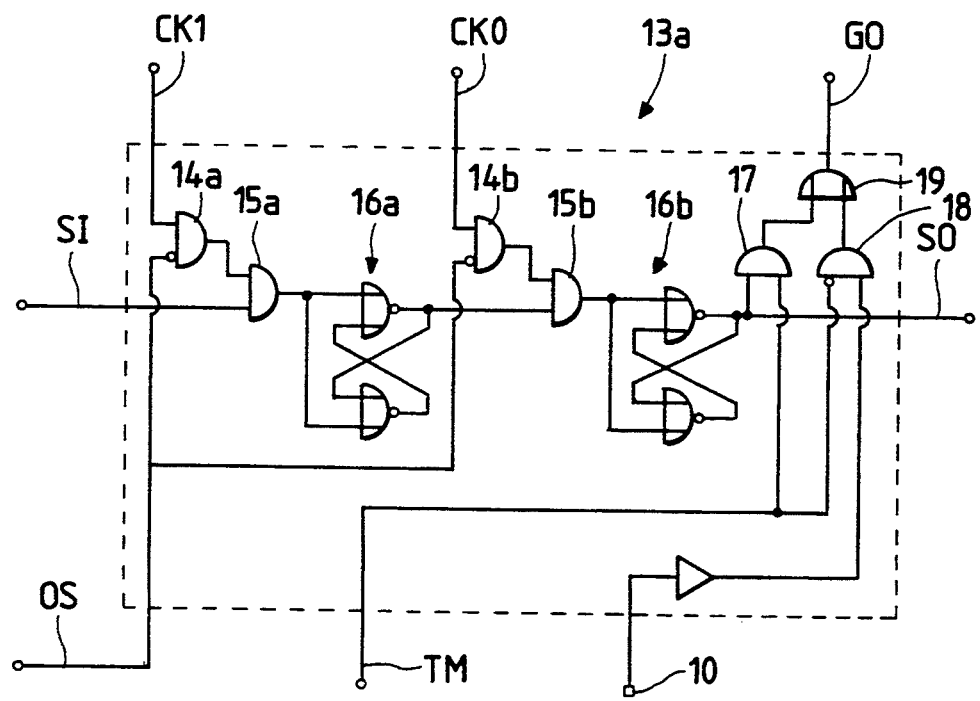
FIG. 10 is an internal circuit diagram of the input shift register shown in FIG. 9.
Figure 11:
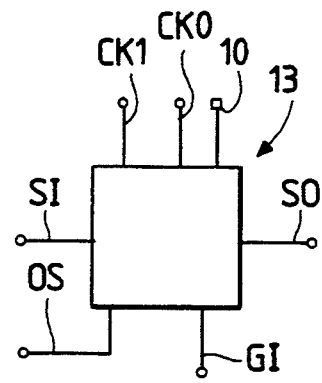
FIG. 11 is a symbolic diagram of an output shift register.
Figure 12:
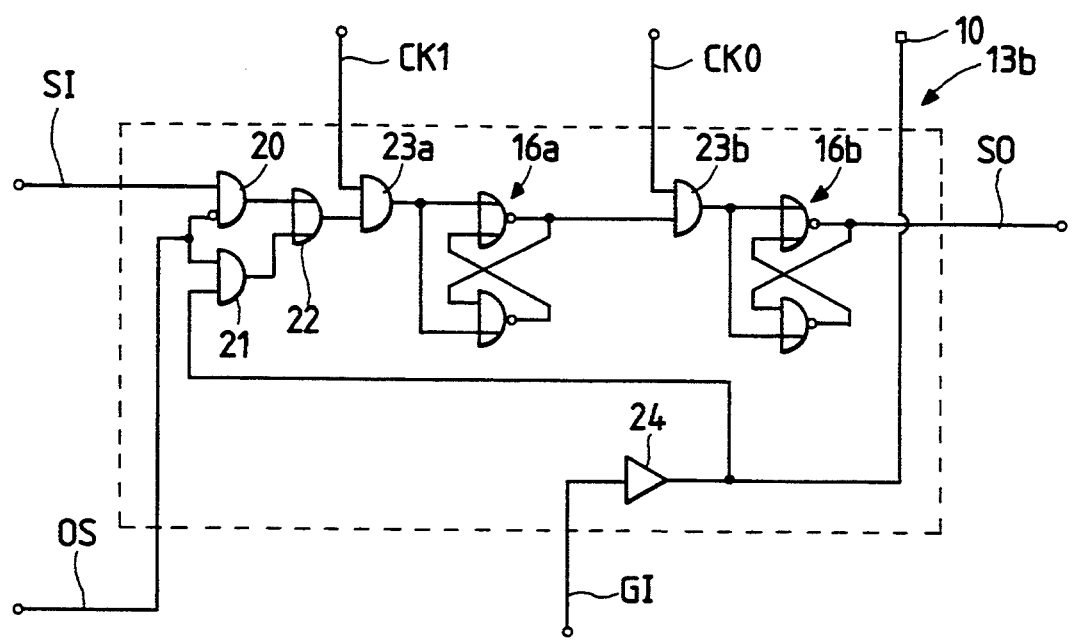
FIG. 12 is an internal circuit diagram of the output shift register shown in FIG. 11.

FIG. 10 shows an internal circuitry of the input shift register 13a. Lines CK1 and CK0 are, respectively, electrically connected to input terminals of AND circuits 15a and 14b (hereinafter referred to simply as AND). Line OS is electrically connected to the other input terminals of ANDs 14a, 14b.

The outputs of ANDs 14a and 14b are electrically connected to input terminals of ANDs 15a and 15b. Line SI is electrically connected to a flip-flop 16a (hereinafter referred to simply as F/F) through AND 15a.

Output of F/F 16a is electrically connected to F/F 16b through through AND 15b. Output of F/F 16b is electrically connected to an input terminal of AND 17 and line SO. Line TM is electrically connected to input terminals of ANDs 17 and 18. Outputs of ANDs 17, 18 are electrically connected to line GO through OR 19.

Thus, upon input of "L" signal to line OS, the ANDs 14a and 14b operate and clock signals are transmitted to ANDs 15a and 15b.

Check data inputted from line SI is shifted-in to F/Fs 16a and 16b in synchronism with the clock signals. Upon input of "H" signal to line TM, the AND 17 operates and check data is inputted to the intra-cell circuit.

On the other hand, upon input of "H" signal to line OS, the AND 20 ceases to operate and, instead, AND 21 operates so that the check data from the intra-cell circuit transmitted to line GI is shifted-in to F/Fs 16a and 16b in synchronism with the clock signals.

At this stage, "L" signal is again inputted to line OS, whereupon the check data is outputted from the output shift register 13b to line OS. It will be noted that if the signals levels of lines TM and OS are at the "L" level, the shift register circuit portion 12 does not operate.

Thus, in this embodiment, the check data inputted in series through the test pads 11 and line D is converted into parallel signals through the shift register circuit portion 12 and the signals transmitted to the intra-cell circuit.

Also, check data which has been outputted in parallel from the intra-cell circuit can be converted into series signals through the shift register circuit portion 12 and the signals taken out from the test pads 11. Therefore, the intra-cell circuit can be checked through a small number, say 5 to 11, of test pads.

Figure 13:
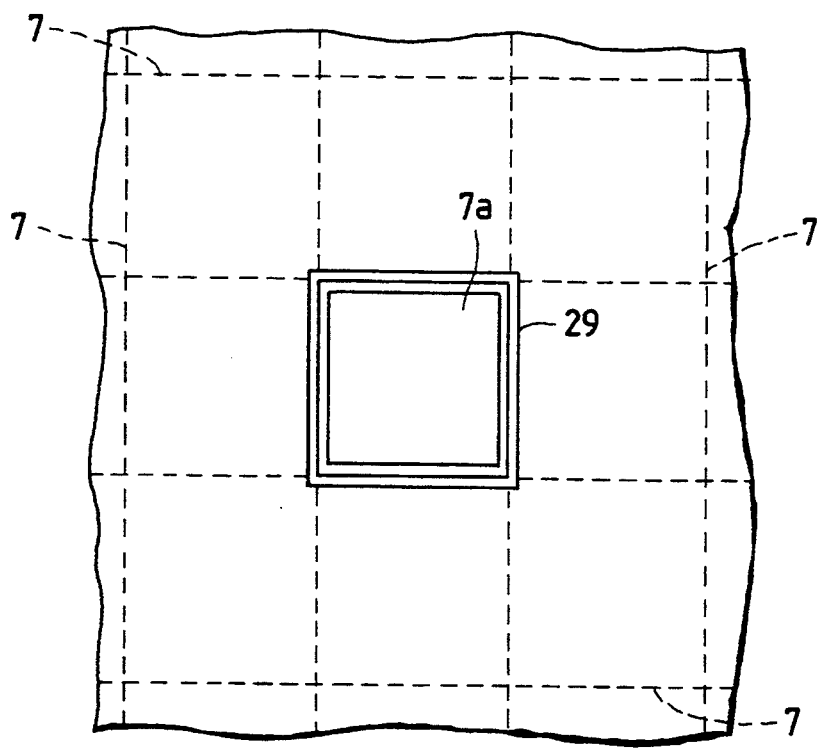
FIG. 13 is a plan view of a substrate after embedding a good macrocell.

Reference is now made to FIG. 13 to illustrate how to remedy defects in view of the plan view on the substrate. In the substrate there are arranged repeatedly large-size chips. Each chip is divided with the macrocells 7. Each macrocell 7 has a test circuit for complete testing thereby discriminating good macrocells from defective macrocells. A defective macrocell 7a is unnecessary and is removed. To this end, each macrocell has a defective macrocell isolating portion 29, with which it can be clearly separated from other macrocells. Any wiring crossing the defective macrocell isolating portion 29 is not formed at all up to this stage. Thus, the defective macrocell 7a can be removed without breakage of any wiring. At the removed portion there can be embedded a good macrocell having substantially the same size. A good macrocell has completely the same function as a macrocell wherein if the defective macrocell portion is not originally defective, it would be used as it is. The originally existing macrocell has some defects, e.g. a failure of transistor in the macrocell owing to crystal defects, a failure in forming an active or passive device due to the presence of dust or foreign matters, or all possible defects such as breakage or short-circuiting of wirings with which the macrocell cannot operate normally. Instead, a good macrocell is replaced. Eventually, if a specific defect takes place in this region, remedy is possible. On all the chips or substrate there are arranged such macrocells. Accordingly, even if there is some defect on any portion of the chip or substrate, such a defect can be remedied irrespective of the number of defects. After replacement of the macrocell, the macrocells are interconnected to form a large chip as a whole. The good chip is arranged on the surface of an exposed SOI substrate and has substantially the same profile shape as neighbouring macrocells. Thus, it is easy to flatten the chip surface.

Figure 14:
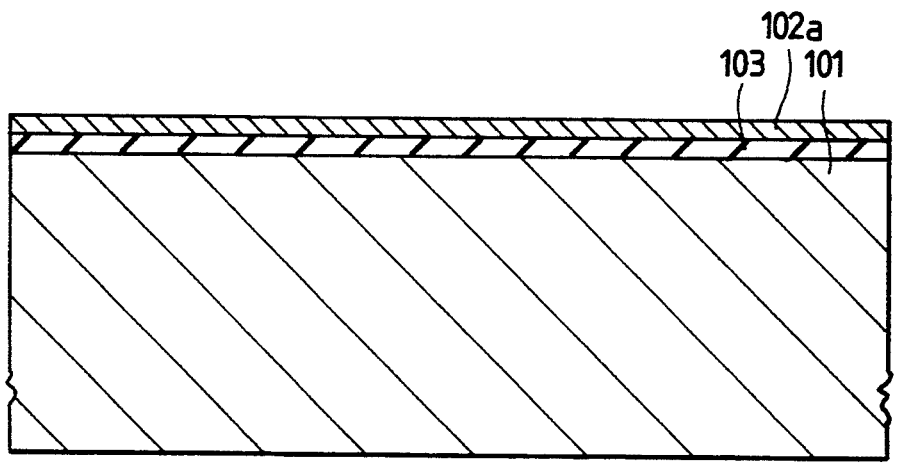
FIG. 14 is a sectional view of an essential part of an SOI substrate.

The semiconductor device manufacturing method of the invention is described in detail. FIG. 14 is a sectional view of an essential part of the SOI substrate. The SOI substrate is an abbreviation for silicon on insulator and has a structure including a silicon layer 102a formed on a silicon oxide film 103 of the SOI substrate. This structure is formed on a silicon substrate 101. The SOI substrate is very useful for ultrahigh integrated and ultrahigh speed LSI in improving breakdown voltage of device, in reducing parasitic capacitance of device for high speed performance, in resisting to troubles with α-ray, or in preventing the latch-up parasitic effect of CMOS device. The invention is applicable to remedy of defects of the SOI substrate having such features as set out above.

Figure 15:
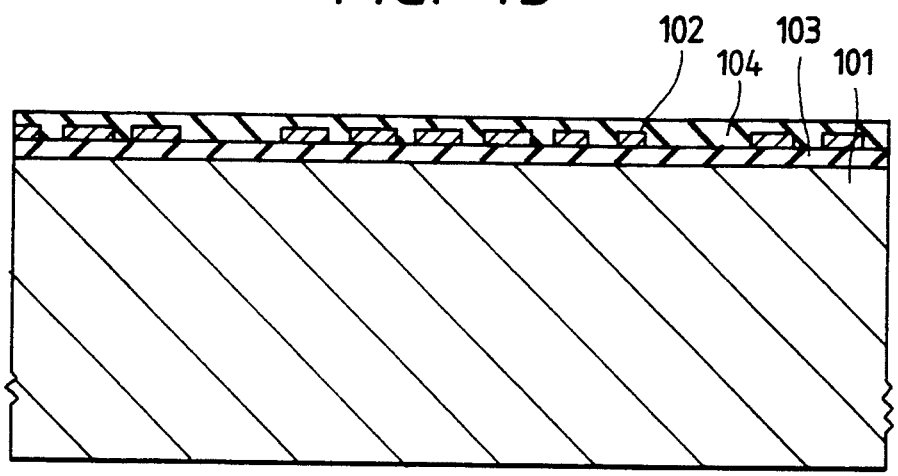
FIG. 15 is a sectional view of an essential part of a substrate showing formation of a silicon device.

FIG. 15 is a sectional view of an essential part of the substrate and illustrates formation of a silicon device. On the silicon oxide film 103 of the SOI substrate are formed a great number of silicon devices 102 in the form of islands which are isolated from one another with a silicon device isolating silicon oxide film 104 formed according to a oxide film isolation process.

Figure 16:
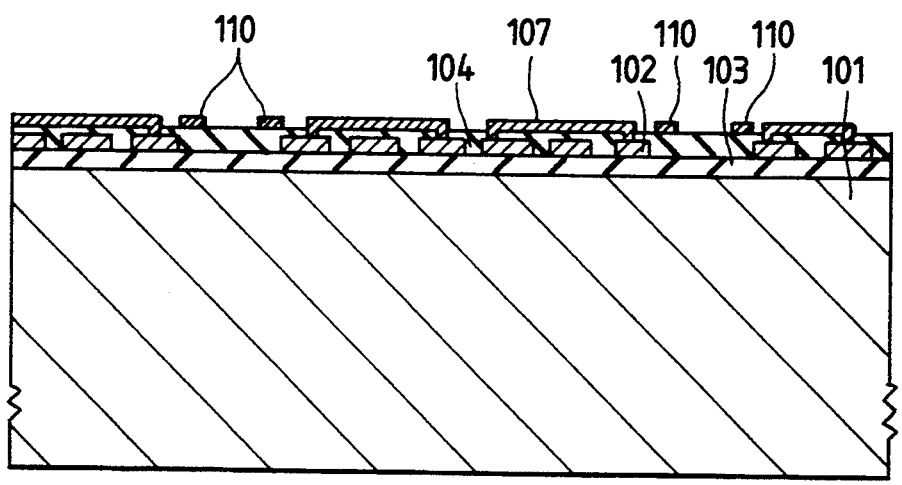
FIG. 16 is a sectional view of an essential part of the substrate obtained immediately after a primary wiring formation process.

FIG. 16 is a sectional view of an essential part of the substrate obtained immediately after the first wiring formation process. A primary wiring 107 interconnects the silicon devices 102 in each macrocell with one another to realize an integrated circuit. Simultaneously, a test circuit can be formed for testing the function of the macrocell. In FIG. 16, a single-layer wiring alone is shown. In general, a plurality of wiring layers are used to provide a complicated highly integrated circuit. There is no primary wiring for interconnecting the macrocells. That is, individual macrocells are electrically independent of one another. Test pads 110 project from the surface of each macrocell and a tester head terminal is brought into abutment with the test pads 110 to test individual macrocells by means of a tester.

Figure 17:
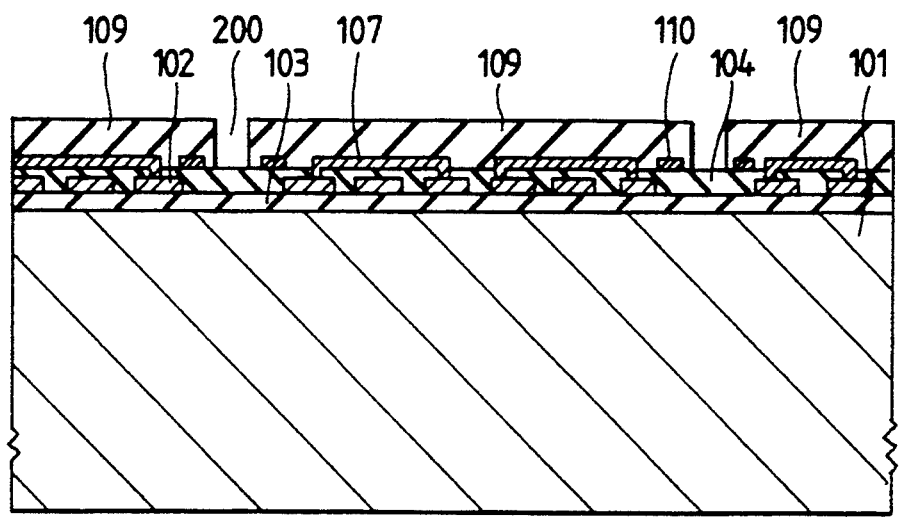
FIG. 17 is a sectional view of an essential part of the substrate obtained immediately after a process wherein a trench pattern for removing a defective macrocell is formed by photolithography.

FIG. 17 is a sectional view of an essential part of the substrate immediately after the process of forming a trench pattern for removing a defective macrocell according to photolithography. A macrocell which has been judged as defective in the above test cannot be used as it is. To remove it, a trench is formed at a boundary portion. To this end, a photoresist film 109 is formed over the entire surface of the substrate and a fine stripe pattern is drawn around the defective macrocell according to a direct drawing machine using an electron beam (EB) to photosensitize the photoresist film 109. A trench 200 is formed using a developer as shown in FIG. 17. The position of the defective macrocell has been preliminarily tested by a tester to obtain information from the tester. The pattern is produced in position according to a program based on the information.

Figure 18:
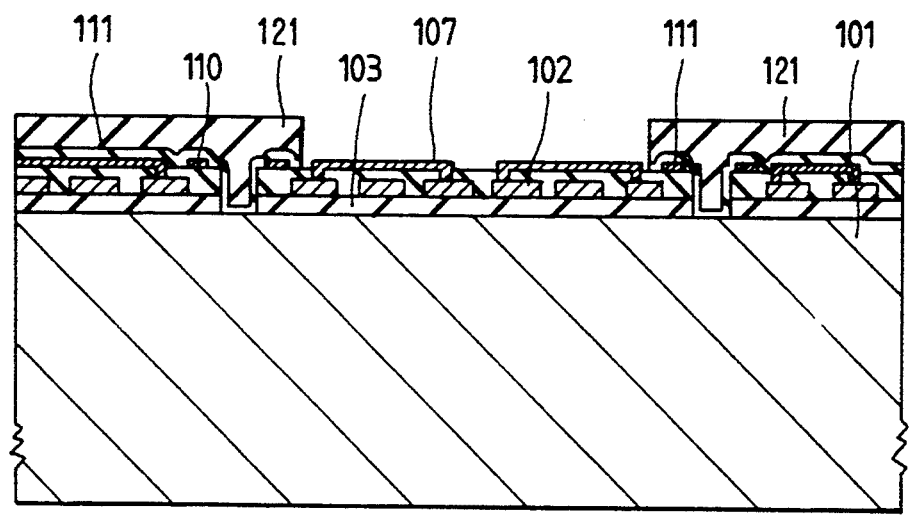
FIG. 18 is a sectional view of an essential part of the substrate obtained after formation of the defective macrocell removing trench and removal of a protective film.

FIG. 18 is a sectional view of an essential part of the substrate obtained immediately after a process of forming the trench for removing the defective macrocell and removing a protective film. The process including from the stage of FIG. 17 to this stage comprises etching the silicon oxide film between the macrocells to a minimal extent to the silicon substrate through the resist film 109 shown in FIG. 17 as a mask. Thereafter, the resist film 109 is removed and a protective film 111 such as a silicon nitride film or a polysilicon film is coated over the entire surface of the SOI substrate. As a material for the protective film, there may be used any material which is resistant to an etchant for the silicon oxide. A rectangular pattern is formed by electron beam from the EB direct drawing machine on the defective macrocell on which a resist film 121 has been applied on the entire surface thereof. By this, the resist film 121 is photosensitized and is developed with a developer to make a kind of window as shown in FIG. 18. The protective film 111 is subjected to dry etching.

Figure 19:
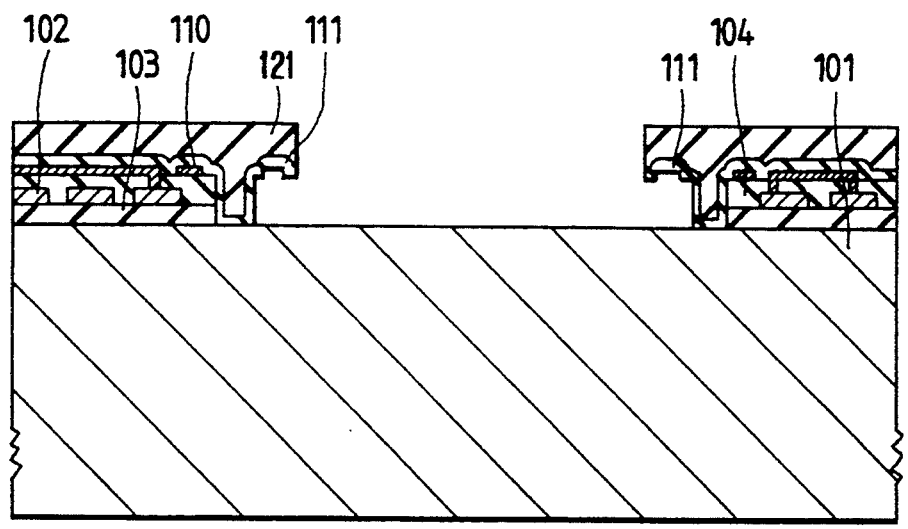
FIG. 19 is a sectional view of an essential part of the substrate obtained immediately after a defective macrocell removing process.

An etchant such as hydrofluoric acid is applied from the window made at the upper surface of the defective macrocell of FIG. 18 to remove the defective macrocell. This is shown in FIG. 19. FIG. 19 is a sectional view of an essential part of the substrate after removal of the defective macrocell. If an etchant which is able to remove the silicon oxide film is used, the silicon devices and the primary wiring in the defective macrocell can be separated and all constituent materials within the defective macrocell can be removed. The etchant is able to etch the silicon oxide alone and and arrives at the silicon substrate 101 after etching of all the silicon oxide. Since the etchant is unable to etch the silicon substrate 101 therewith, the upper surface of the silicon substrate 101 is exposed, making it very easy to ensure a flattened surface. The flattened surface has a mirror flatness of the silicon substrate at the time of fabrication of the SOI substrate and is thus a very flat mirror surface. The depth of the removal of the defective macrocell is determined from the position of the silicon oxide layer of the SOI substrate from the upper surface. Thus, it is possible to make a uniform depth at any position of the substrate with a very small error. The above process enables one to form a mirror surface much more easily than known mechanical or other methods.

Figure 20:
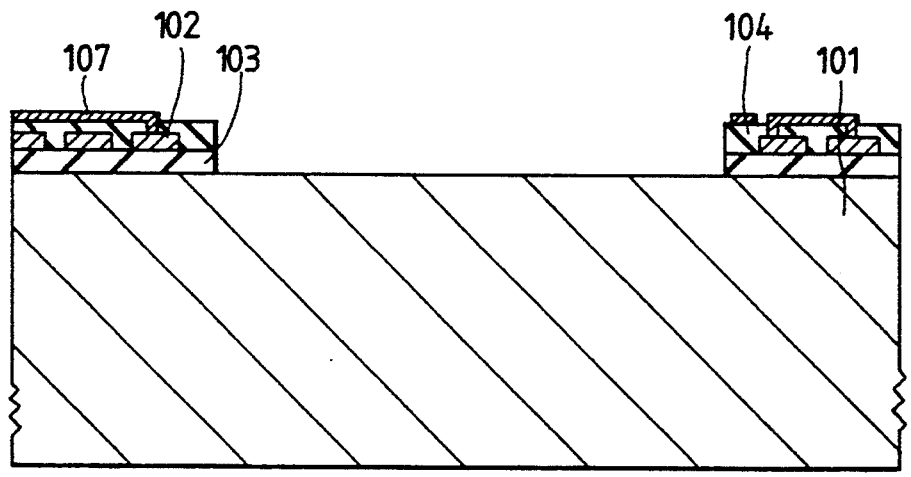
FIG. 20 is a sectional view of an essential part of the substrate obtained after removal of a photoresist and a nitride film.

FIG. 20 is a sectional view of an essential part of the substrate obtained immediately after the process of removing the resist film 121 and the protective film 111 shown in FIG. 19.

Figure 21:
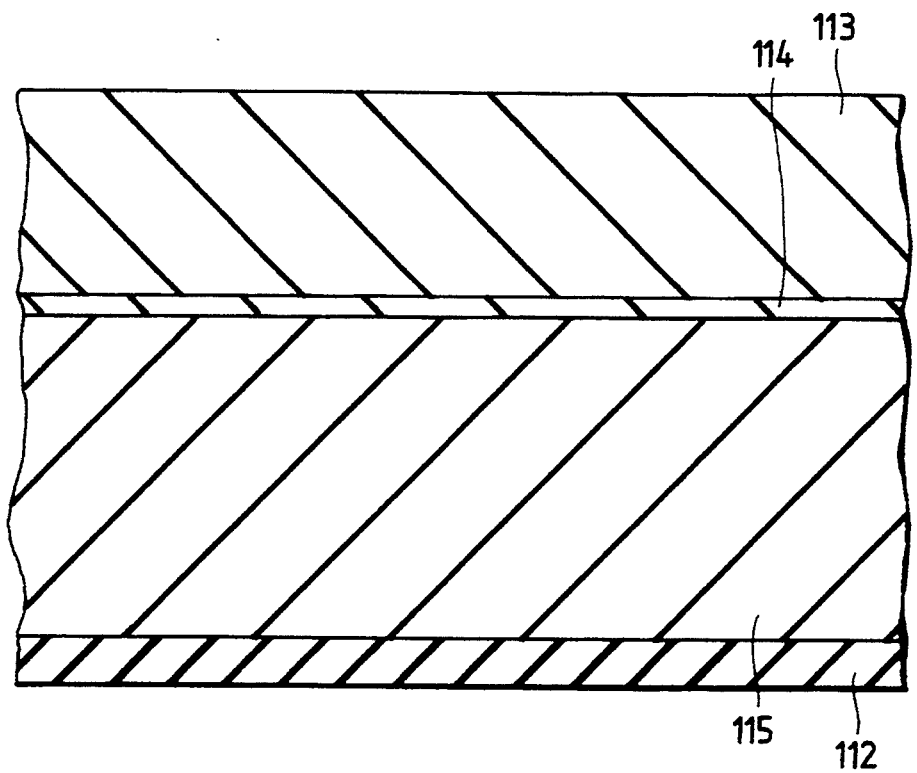
FIG. 21 is a sectional view of an essential part of a substrate for supporting good macrocells.

A process for mounting a macrocell having the same function as other good macrocells in the portion from which the defective macrocell has been removed as set out hereinbefore is described. Initially, a substrate for supporting a good macrocell which has been preliminarily provided is shown in FIG. 21 which is a sectional view of an essential part of the substrate. In the figure, a support substrate 115 such as a quartz substrate with substantially the same size as the SOI substrate is provided. The support substrate 115 is attached to a tape 113 having an adhesive layer 114, such as a dicing tape. The support substrate 115 is applied thinly with a temporary adhesive 112 such as wax.

Figure 22:
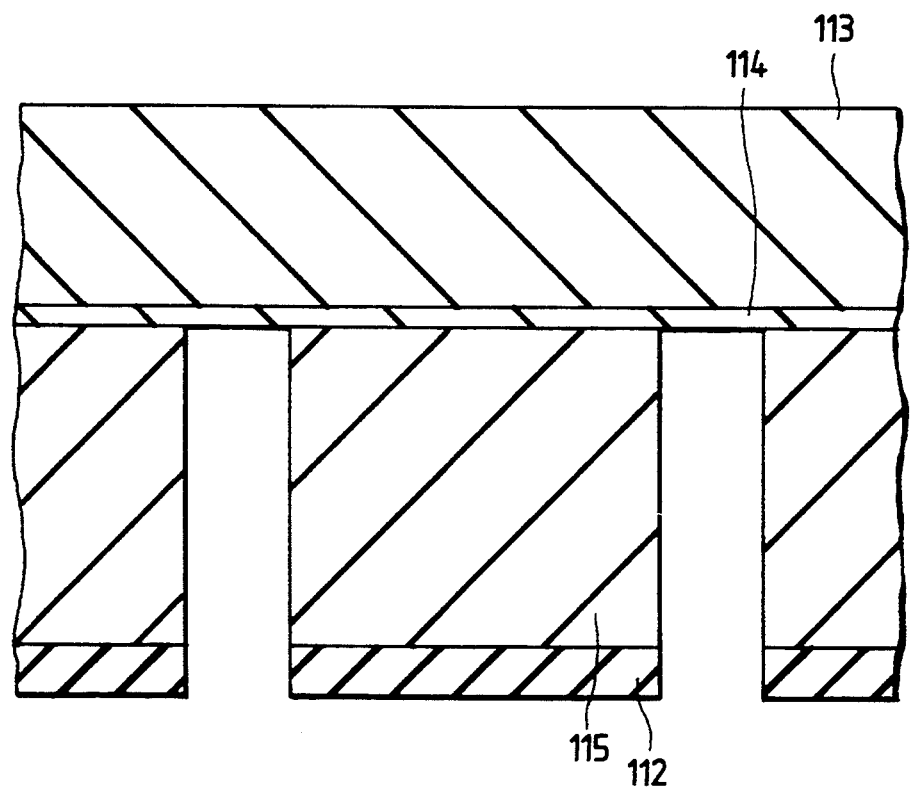
FIG. 22 is a sectional view of an essential part of a substrate after processing the substrate for supporting good macrocells.

FIG. 22 is a sectional view of an essential part of the substrate for supporting a good macrocell immediately after processing. That is, the support substrate 115 is formed with a trench with a size which is the same as or slightly smaller than the size of the good macrocell, by dicing or by application of a laser beam. The trench is so made that the tape 113 is not cut to the full extent. By this, the support substrate 115 is not separated.

Figure 23:
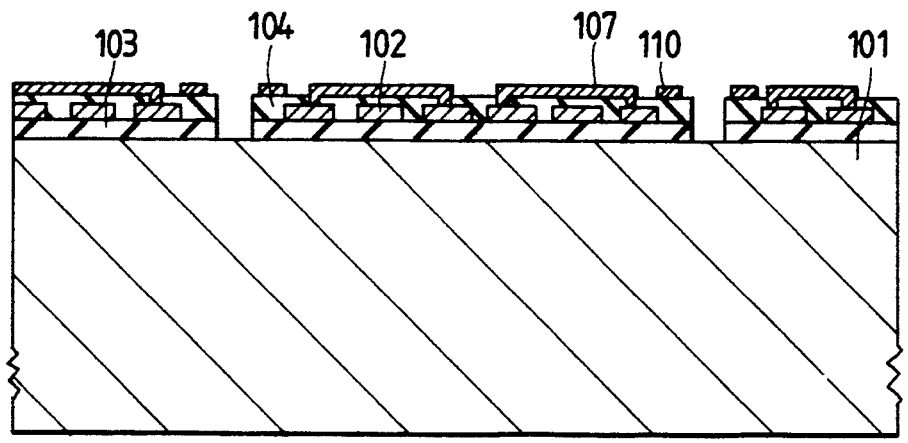
FIG. 23 is a sectional view of an essential part of a substrate on which good macrocells are formed.

FIG. 23 is a sectional view of an essential part of a substrate on which a good macrocell is formed. The macrocell has been confirmed to be a good one by use of the test pad 110. The macrocell is formed on a portion different from a macrocell which has been judged as defective. For instance, such a macrocell may be on a substrate of a specific lot or on a substrate of the same lot. In the fabrication of semiconductors, macrocells having the same function may be repeatedly fabricated in accordance with a batchwise system at the same time or at small time intervals. Thus, a portion having a good macrocell can be formed in very large amounts at the same time. In FIG. 23, around the good macrocell there is formed a trench, which arrives at the silicon substrate 101 at a minimum, so that the outermost size of the good macrocell is so determined as to be slightly smaller than the outermost size of a removed portion of the defective macrocell. This forming method can be readily achieved using a photolithographic technique which has been ordinarily carried out in semiconductor devices.

Figure 24:
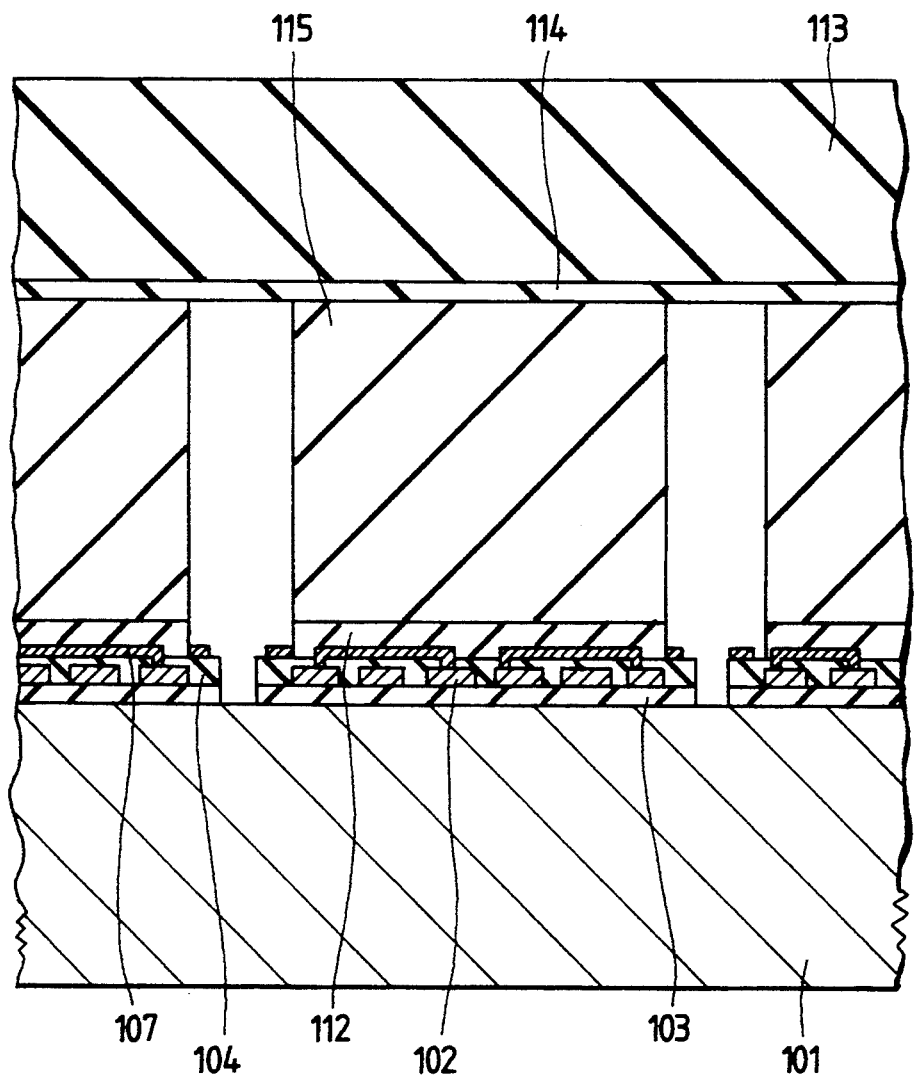
FIG. 24 is a sectional view of an essential part of the substrate shown in FIG. 23 and the supporting substrate shown in FIG. 22 which are bonded together.

FIG. 24 is a sectional view of an essential part of the substrate immediately after bonding between the good macrocell shown in FIG. 23 and the support substrate shown in FIG. 22. While positioning on the upper surface of the good macrocell, the support substrate 115 can be connected by means of the preliminarily attached adhesive 112. The support substrate 115 is connected in order to avoid a bend owing to the internal stress of the good macrocell which is in a thin film state as will be described later.

Figure 25:
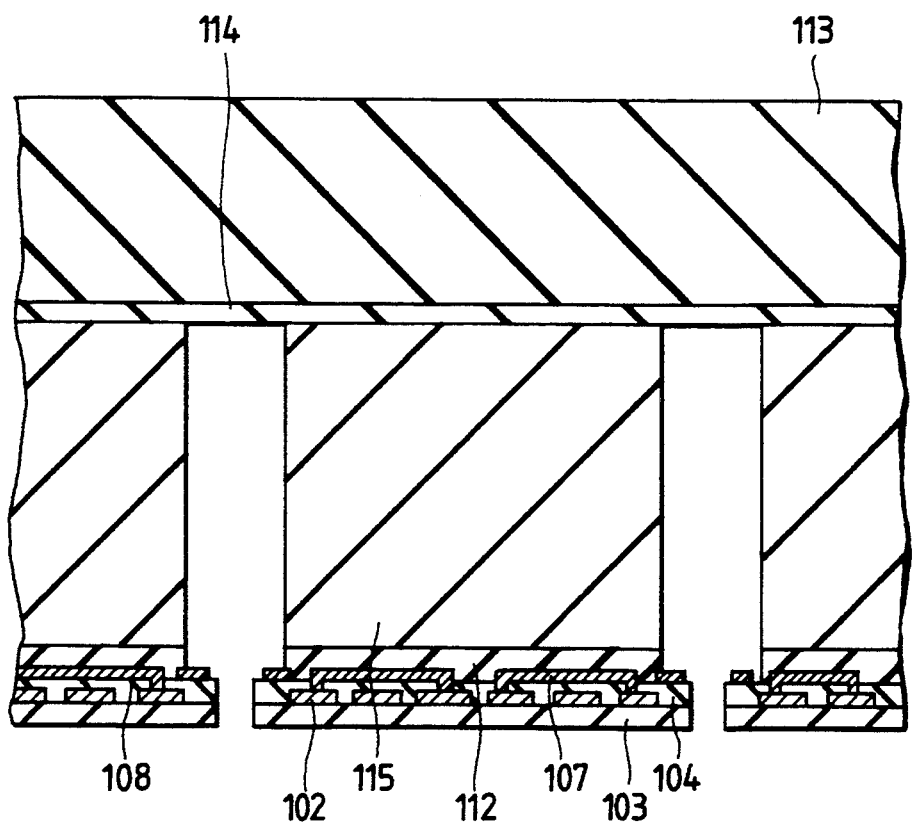
FIG. 25 is a sectional view of an essential part of the substrate after removal of a silicon layer at the back side of good macrocells.

FIG. 25 is a sectional view of an essential part of the substrate immediately after the end of the process of removing the silicon at the back side of the macrocell.

The silicon substrate 101 shown in FIG. 24 can be readily removed by a method of etching silicon alone which is ordinarily used for the fabrication of semiconductor devices. More particularly, this can be realized by a method using KOH (potassium hydroxide) or hydrazine or a dry etching method. Accordingly, the silicon oxide film for forming a good macrocell is left. In this process, all the silicon devices 102 and the primary wirings 107 which ensure electric operation of the macrocell are completely protected.

Figure 26:
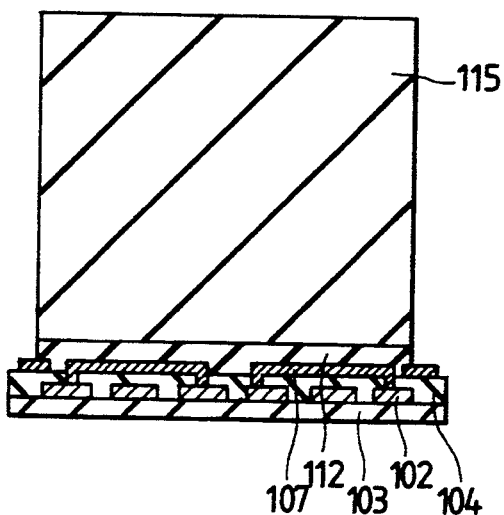
FIG. 26 is a sectional view of an essential part of the substrate after separation of a good macrocell.

FIG. 26 is a sectional view of the substrate immediately after the end of a process of separating a good cell. By removal of the tape 113 and the self-adhesive 114 of FIG. 25, it becomes possible to readily take out a good macrocell of the shape as shown in FIG. 26. The good macrocell is maintained in a state of from a complete film to a state equivalent to bulk by means of the support substrate 115. The internal stresses in the good macrocell are held completely in the same state as those prior to removal of the silicon substrate 101.

Figure 27:
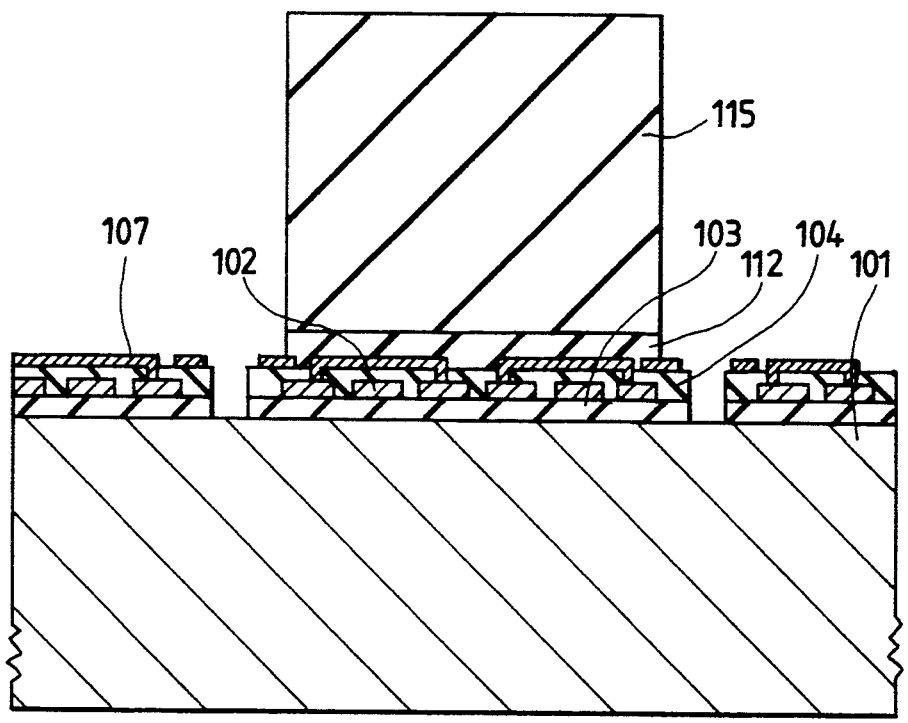
FIG. 27 is a sectional view of the substrate after embedding the good macrocell shown in FIG. 26 in the defective macrocell-removed portion.

FIG. 27 is a sectional view of an essential part of the substrate immediately after the end of a process of embedding the good macrocell shown in FIG. 26 in the defective macrocell removed portion shown in FIG. 20. At the time, it is necessary to apply an adhesive to the bottom surface of the silicon oxide film 103 of the SOI substrate. A sol-gel or silanol groups used in combination with steam may be utilized for the adhesion, or organic adhesives may be used for this purpose. The good macrocell may be positioned by utilizing a mark on the surface of the semiconductor substrate by use of a handling device using the support substrate.

Figure 28:
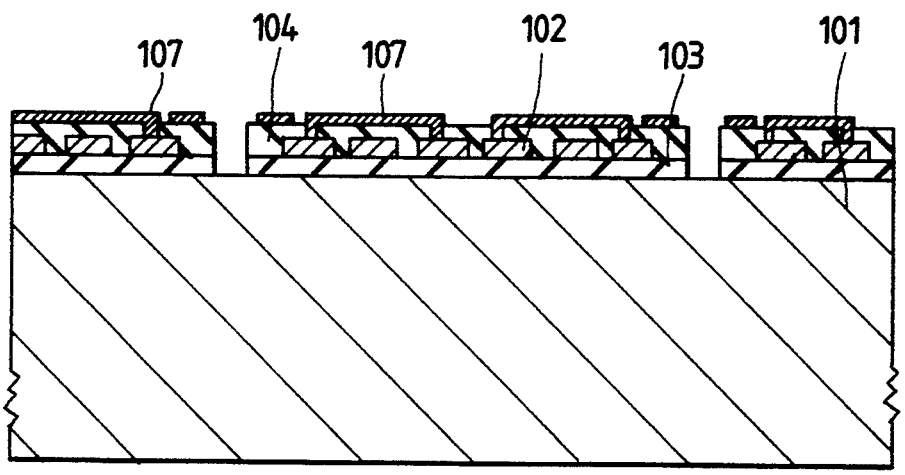
FIG. 28 is a sectional view of an essential part of the substrate after removal of the good macrocell supporting substrate shown in FIG. 27.
Figure 29:
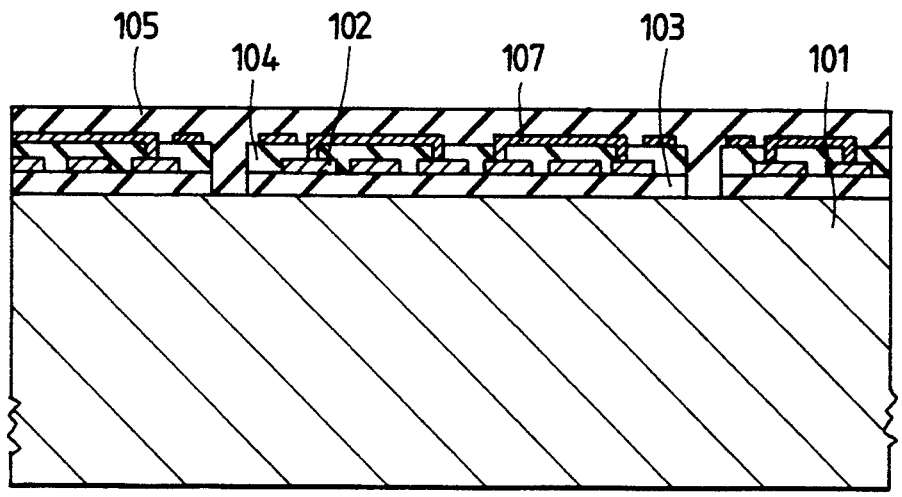
FIG. 29 is a sectional view of an essential part of the substrate after embedding of the trenches at the main surface side of the substrate shown in FIG. 28.

FIG. 28 is a sectional view of an essential part of the substrate immediately after the end of a process of removing the macro cell support substrate of FIG. 27. FIG. 29 is a sectional view of an essential part of the substrate immediately after the end of a process of embedding the trench at the main surface side of the substrate. The trench can be embedded by using known techniques of embedding and flattening trenches of semiconductor.

Figure 30:
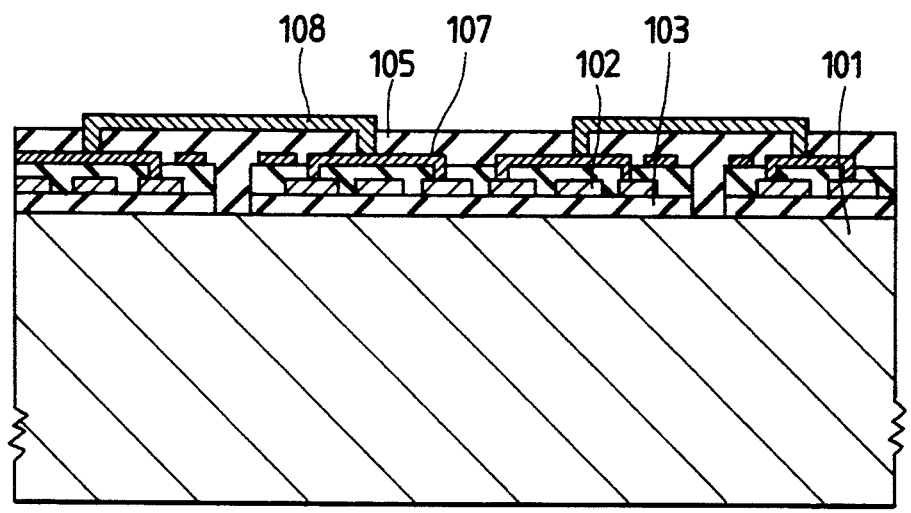
FIG. 30 is a sectional view of an essential part of the substrate after secondary wiring.

The embedded macrocell and a number of macrocells on the upper surface of the substrate are interconnected by means of secondary wirings 108 as shown in FIG. 30. In the figure, single-layer secondary wirings are shown but wirings having a plurality e layers may be used without limitation. On the secondary wirings there is formed the surface silicone film 106 shown in FIG. 1, thereby forming a complete chip.

Figure 31:
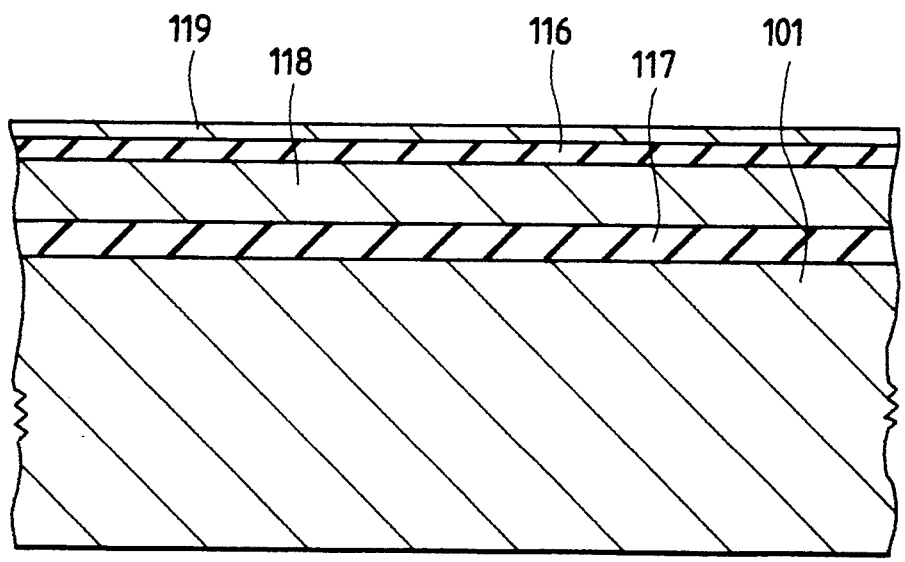
FIG. 31 is a sectional view of an essential part of a substrate building two insulating films therein.

FIG. 31 is a sectional view of an essential part of the substrate having double-layered insulating films built therein. The substrate includes a silicon substrate 101, on which there exist a first silicon oxide film 116 of the SOI substrate, a silicon layer 119, a second silicon oxide film 117 of the SOI substrate, and a silicon layer 118 as shown. The reason why such a structure is arranged is that by providing the second silicon oxide film 117 of the SOI substrate as a stopping layer for isolating adjacent macrocells, devices of the SOI substrate are formed. More particularly, consideration is given such that the first silicon film 116 of the SOI substrate and the silicon layer 119 can be designed optimumly and that damages of processing do not influence the silicon devices owing to the existence of the silicon layer 118.

Figure 32:
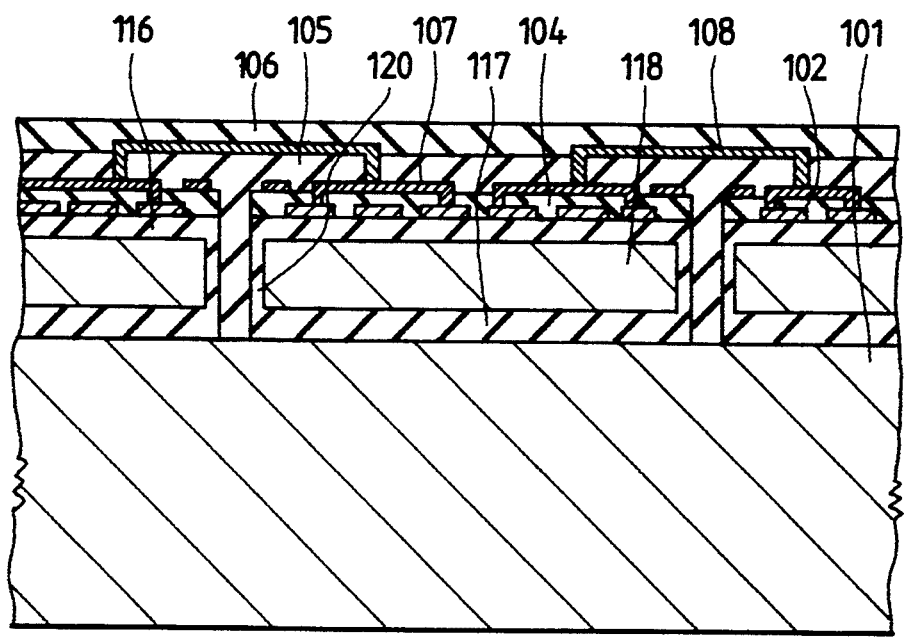
FIG. 32 is a sectional view of an essential part of the substrate building two insulating therein wherein a macrocell is replaced.

Based on this structure, the good macrocell has been embedded and the secondary wirings have been made. FIG. 32 is a sectional view of an essential part of the substrate immediately after the end of the embedding and secondary wirings. The trench forming trench is protected with a silicon oxide film 120.

Figure 33:
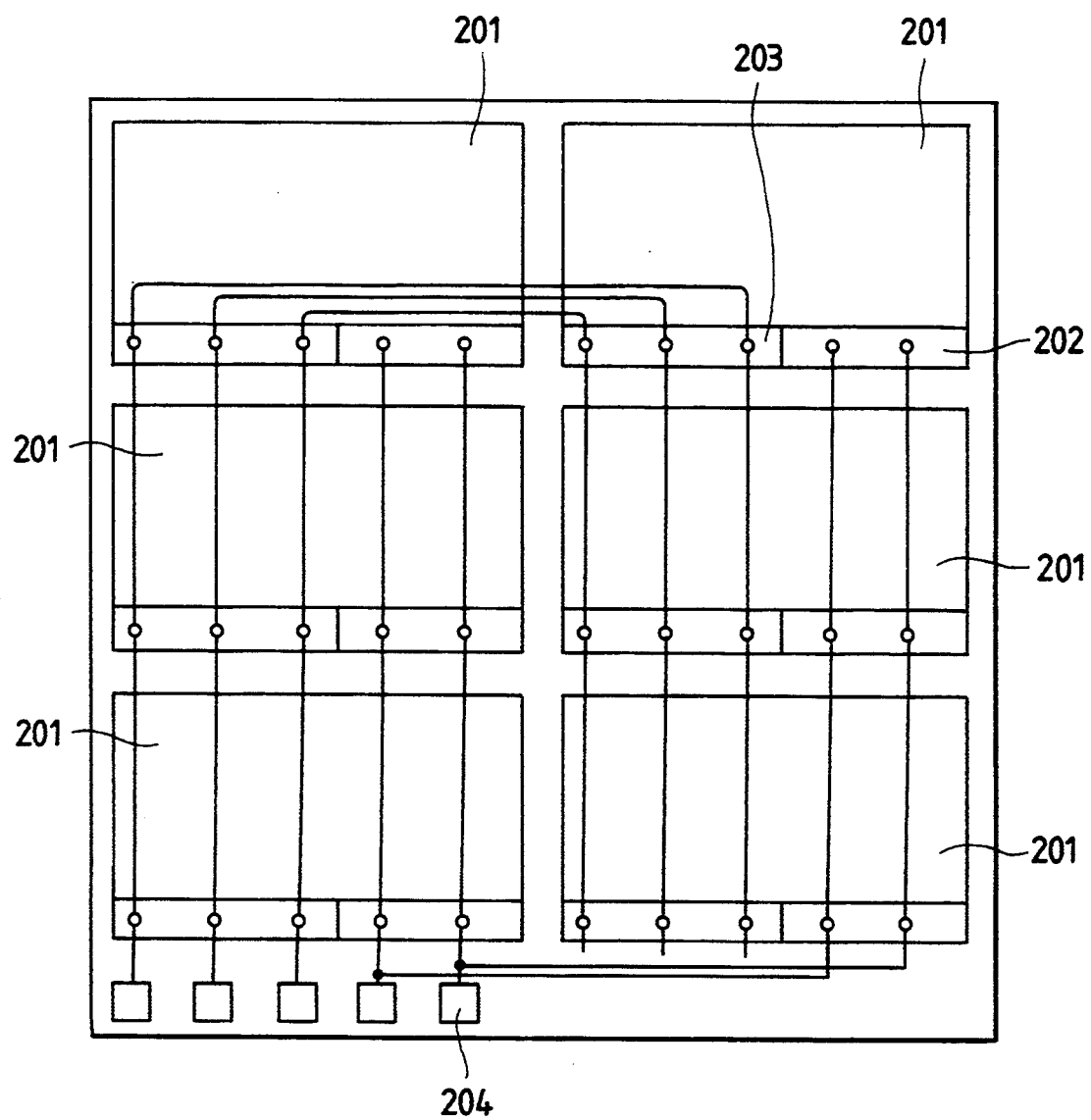
FIG. 33 is a schematic view of a memory LSI according to the invention.

FIG. 33 is a view showing an example wherein the invention is applied to a memory LSI. Each macrocell has a memory cell part 201, an address control unit 202 and a data input-output unit 203. The macrocells are interconnected through common pads 204 to provide a final LSI. The respective macrocells can be independently tested. When one or plural macrocells are defective, they can be replaced by good ones to provide an LSI wherein all macrocells are good. Thus, an LSI of a very large capacitance which operates in a complete manner can be obtained.

While we have described several embodiments in accordance with the present invention, it is understood that the same is not limited thereto, but is susceptible of numerous changes and modifications without departing from the scope of the invention.

For instance, in the foregoing embodiments, a good macrocell for replacement has been arranged in a chip region instead of a defective macrocell. The invention is not limited thereto, but a different type of macrocell may be arranged in the chip region. More particularly, a macrocell having a different circuit function is replaced, by which the logical function may be changed or the circuit function may be extended. For instance, it is possible to embed an optical electronics integrated circuit (OEIC) cell in a chip such as a reduced instruction set computer (RISC) processor comprising a CMOS circuit. The OEIC cell may be arranged in a defective macrocell removed region or in other region. When optical fibers are used for signal transmission between the chip and a main memory or an external memory, ultrahigh speed data transmission is possible. When the chip is used, for example, in a work station, the performance of the work station can be remarkably improved, thereby enabling creation of a new value of product.

If a different type of chip is embedded as set out above, it is not always necessary to check whether a macrocell is good or defective.

EMBODIMENT 2

Figure 34:
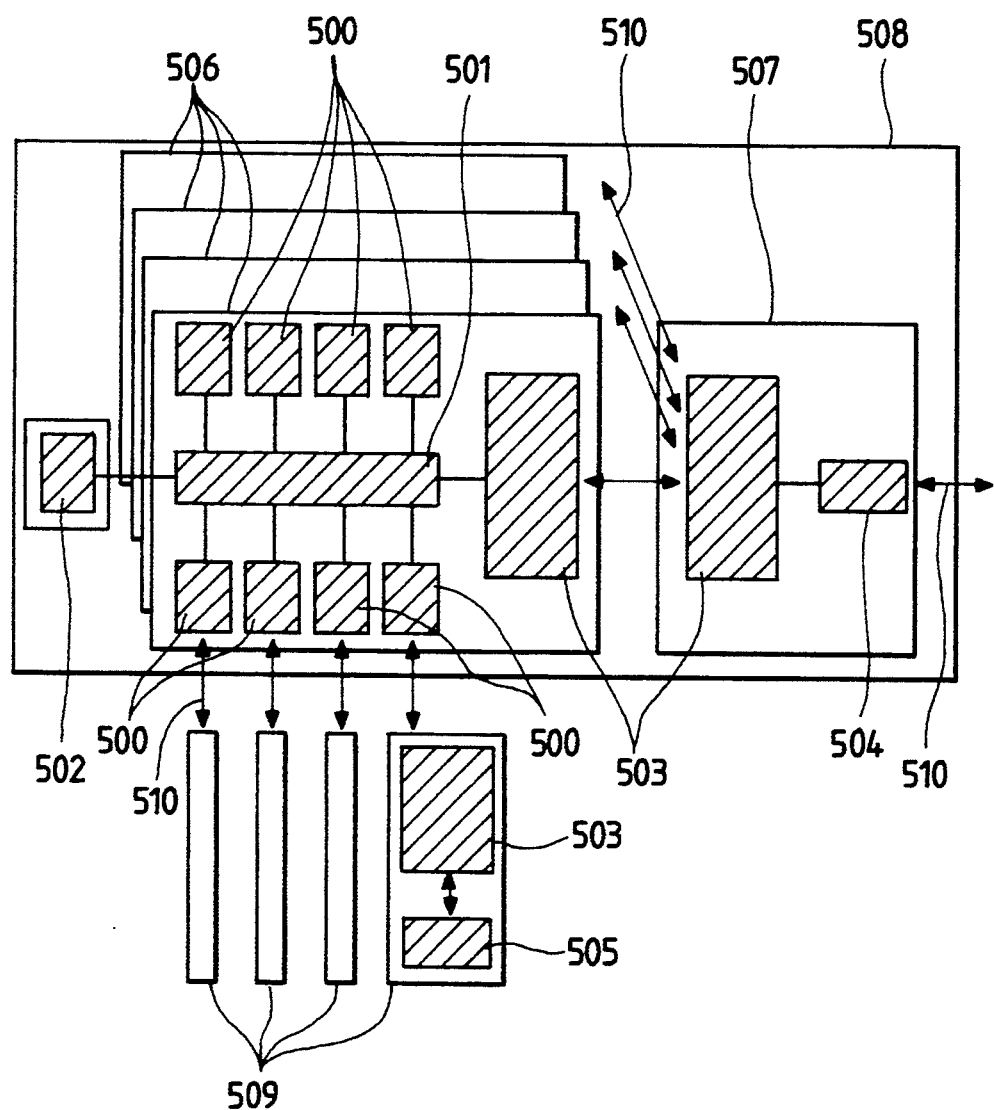
FIG. 34 is a schematic view showing a computer system according to the invention.

Another embodiment of the invention is described with reference to FIG. 34 which is a diagram showing a computer system. In this embodiment, a semiconductor integrated circuit of the invention is applied to a high-speed large computer which comprises a plurality of processors 500 for processing instruction and operation which are connected in parallel. In the embodiment, the high-speed semiconductor integrated circuit to which the present invention is applied has a high degree of integration, so that at least one of the processors 500 for processing instruction and operation, a memory control device 501 and a main memory 502 is constituted of a semiconductor chip whose length is about 10 to 30 mm in one side. The processors 500 for processing instruction and operation, memory control device 501 and a data communication interface 503 comprising a compound semiconductor integrated circuit are mounted on the same ceramic substrate 506. Moreover, a data communication interface 503 and a data communication 504 are mounted on the same ceramic substrate 507. These ceramic substrates 506 and 507 and a ceramic substrate mounting a main memory 502 thereon are mounted on a substrate whose side has about 50 cm or below in length, thereby forming a central processing unit 508 of a large computer. The communication of data within the central processing unit 508, between a plurality of the central processing units or between the data communication interfaces 503 and the substrate 509 mounting an input-output processor 505 are carried out through through optical fibers 510 indicated by lines arrowheaded at opposite ends. This computer has silicon semiconductor integrated circuits such as the processors 500 for processing instruction and operation, the memory control unit 501, and the main memory 502 arranged in parallel and operates at high speed. The communication of data is performed through a medium of light, so that the number of instruction processings per second can be increased significantly.

Typical effects attained by the embodiments disclosed in the present invention can be summarized as follows.

According to an embodiment wherein a defective macrocell is removed utilizing an SOI substrate and wherein a good macrocell is also made using an SOI substrate, the silicon oxide layer of the SOI substrate is appropriately used to process the defective macrocell and the good macrocell easily and in high accuracy. The replacement of macrocell can be made without involving any microcrack in reliability higher than in mechanical methods. As a result, the reliability and yield of the semiconductor integrated circuit devices can be improved.

If a macrocell having a different type of circuit function is provided in a chip region, it is possible to alter the logic of the semiconductor integrated circuit and to extend its function.

Moreover, the application Of the concept of the invention to computers ensures high processing.

It will be further understood by those skilled in the art that the foregoing description is directed to preferred embodiments of the disclosed devices and that various changes and modifications may be made in the invention without departing from the spirit and scope thereof.

What is claimed is:

1. A method for manufacturing a semiconductor integrated circuit device which comprises:
    providing an SOI substrate which has a first insulating film and a semiconductor layer formed on said first insulating film;
    forming, in a region of said semiconductor layer of said SOI substrate, a chip which comprises a plurality of macrocells each of which comprises an integrated circuit element having a second insulating film whose etching rate is substantially the same as that of said first insulating film and a portion of which is on said first insulating film;
    forming primary wirings in the respective macrocells, said primary wirings being independent of one another;
    forming a trench extending through said first insulating film around an outer periphery of a first macrocell;
    forming, on said SOI substrate having the trench, a protective film whose etching rate differs from the first and second insulating films;
    exposing said protective film on said first macrocell while keeping said protective film on the trench as covered;
    etching the exposed protective film;
    etching the first and second insulating films and removing said first macrocell from said SOI substrate;
    removing the protective film;
    embedding a second macrocell, which differs in operational characteristics from said first macrocell, in the position where said first macrocell has existed and fixing said second macrocell in the position;
    forming a third insulating film on said SOI substrate having said trench and the first primary wiring layer to flatten the surface;
    forming openings in position of said third insulating film; and
    forming secondary wirings on said SOI substrate having the openings and interconnecting adjacent macrocells with each secondary wiring through the openings.

2. A method for manufacturing a semiconductor integrated circuit device according to claim 1, wherein said first macrocell is a reduced instruction set computer comprising a CMOS circuit and said second macrocell is an optical electronics integrated circuit.

3. A method for manufacturing a semiconductor integrated circuit device which comprises:
    providing an SOI substrate which has a first insulating film and a semiconductor layer formed on said first insulating film;
    forming, in a region of said semiconductor layer of said SOI substrate, a chip which comprises a plurality of macrocells each of which comprises an integrated circuit element having a second insulating film whose etching rate is substantially the same as that of said first insulating film and which arrives at said first insulating film, and a test circuit for testing whether each integrated circuit element is defective or non-defective;
    forming primary wirings in the respective macrocells, said primary wirings being independent of one another;
    checking whether each integrated circuit element is defective or non-defective by use of said test circuit;
    forming a trench extending through said first insulating film around an outer periphery of a macrocell which has been judged as defective by the checking step;
    forming, on said SOI substrate having the trench, a protective film whose etching rate differs from the first and second insulating films;
    exposing said protective film on said defective macrocell while keeping said protective film on the trench as covered;
    etching the exposed protective film;
    etching the first and second insulating films and removing said defective macrocell from said SOI substrate;
    removing the protective film;

embedding a non-defective macrocell in the position where said defective macrocell has existed and fixing said non-defective macrocell in the position;

forming a third insulating film on said SOI substrate having said trench and the first primary wiring layer to flatten the surface;

forming openings in position of said third insulating film; and forming secondary wirings on said SOI substrate having the openings and interconnecting adjacent macrocells with each secondary wiring through the openings.

4. A method for manufacturing a semiconductor integrated circuit device according to claim 3, wherein a substrate below the first insulating film of said SOI substrate comprises silicon and the first and second insulating films are each made of silicon dioxide.

5. A method for manufacturing a semiconductor integrated circuit device according to claim 3, wherein said protective film comprises silicon nitride or polysilicon.

6. A method for manufacturing a semiconductor integrated circuit device according to claim 4, wherein the first and second insulating films are etched with hydrofluoric acid.

7. A method for manufacturing a semiconductor integrated circuit device according to claim 3, wherein each integrated circuit element is a gate array.

8. A method for manufacturing a semiconductor integrated circuit device according to claim 3 wherein each integrated circuit element is an SRAM or analog circuit.

9. A method for manufacturing a semiconductor integrated circuit device according to claim 3, wherein said semiconductor integrated circuit elements are elements having different circuits, respectively.

10. A method for manufacturing a semiconductor integrated circuit device according to claim 3, wherein said non-defective macrocell is fixed by utilizing a sol-gel or silanol groups used in combination with steam.

11. A method for manufacturing a semiconductor integrated circuit device according to claim 3, wherein said SOI substrate further comprises an insulating film provided beneath said first insulating film.

12. A method for manufacturing a semiconductor integrated circuit device according to claim 3, wherein the step of exposing said protective film on said defective macrocell while keeping said protective film on the trench as covered includes the steps of forming on said protective film a resist film which is patterned by means of an electron beam direct drawing machine based on information obtained at the time of the check.

* * * * *